US012581766B2

(12) United States Patent
Bando

(10) Patent No.: US 12,581,766 B2
(45) Date of Patent: Mar. 17, 2026

(54) SOLID-STATE IMAGING DEVICE AND ELECTRONIC EQUIPMENT

(71) Applicant: SONY SEMICONDUCTOR SOLUTIONS CORPORATION, Kanagawa (JP)

(72) Inventor: Masashi Bando, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 41 days.

(21) Appl. No.: 18/578,328

(22) PCT Filed: Mar. 31, 2022

(86) PCT No.: PCT/JP2022/016641
§ 371 (c)(1),
(2) Date: Jan. 11, 2024

(87) PCT Pub. No.: WO2023/013178
PCT Pub. Date: Feb. 9, 2023

(65) Prior Publication Data
US 2024/0321929 A1 Sep. 26, 2024

(30) Foreign Application Priority Data

Aug. 3, 2021 (JP) ................................. 2021-127784

(51) Int. Cl.
*H10F 39/00* (2025.01)
*H04N 25/77* (2023.01)
*H04N 25/79* (2023.01)
(52) U.S. Cl.
CPC ........... *H10F 39/811* (2025.01); *H04N 25/77* (2023.01); *H04N 25/79* (2023.01); *H10F 39/8037* (2025.01)

(58) Field of Classification Search
CPC .... H10F 39/811; H10F 39/8037; H10F 39/12; H04N 25/77; H04N 25/79; H04N 25/70; H04N 25/771
See application file for complete search history.

(56) References Cited

U.S. PATENT DOCUMENTS 10,944,931 B2 * 3/2021 Shinohara ............ H04N 25/709
2013/0001650 A1 * 1/2013 Ohtsuki ................ H10F 39/802
257/E27.15
(Continued)

FOREIGN PATENT DOCUMENTS

JP 2001-156178 A 6/2001
JP 2010-153905 A 7/2010
(Continued)

OTHER PUBLICATIONS

International Search Report and Written Opinion of PCT Application No. PCT/JP2022/016641, issued on Jul. 5, 2022, 12 pages of ISRWO.

*Primary Examiner* — Shahbaz Nazrul
(74) *Attorney, Agent, or Firm* — CHIP LAW GROUP

(57) ABSTRACT

Provided is a solid-state imaging device including a photoelectric conversion section, a first transistor, a floating diffusion layer, a second transistor, a conductive layer, and a wiring layer. The photoelectric conversion section photoelectrically converts incident light and accumulates electric charge. The first transistor transfers the electric charge accumulated in the photoelectric conversion section. The floating diffusion layer retains the electric charge transferred by the first transistor. The second transistor amplifies the electric charge retained in the floating diffusion layer. The conductive layer conducts to the floating diffusion layer. The wiring layer causes capacitive coupling with the conductive layer and conducts to a source of the second transistor.

17 Claims, 14 Drawing Sheets

(56) References Cited

U.S. PATENT DOCUMENTS

| | | | |
|---|---|---|---|
| 2016/0293654 A1* | 10/2016 | Tomekawa | H10F 39/8037 |
| 2018/0063459 A1 | 3/2018 | Stark | |
| 2018/0342553 A1* | 11/2018 | Toyoguchi | H10F 39/182 |

FOREIGN PATENT DOCUMENTS

| | | | |
|---|---|---|---|
| JP | 2011-199185 A | 10/2011 | |
| JP | 2012-028677 A | 2/2012 | |
| JP | 2014-096669 A | 5/2014 | |
| WO | 2016/199588 A1 | 12/2016 | |
| WO | 2018/105334 A1 | 6/2018 | |
| WO | 2020/090150 A1 | 5/2020 | |

* cited by examiner

1:SOLID-STATE IMAGING DEVICE

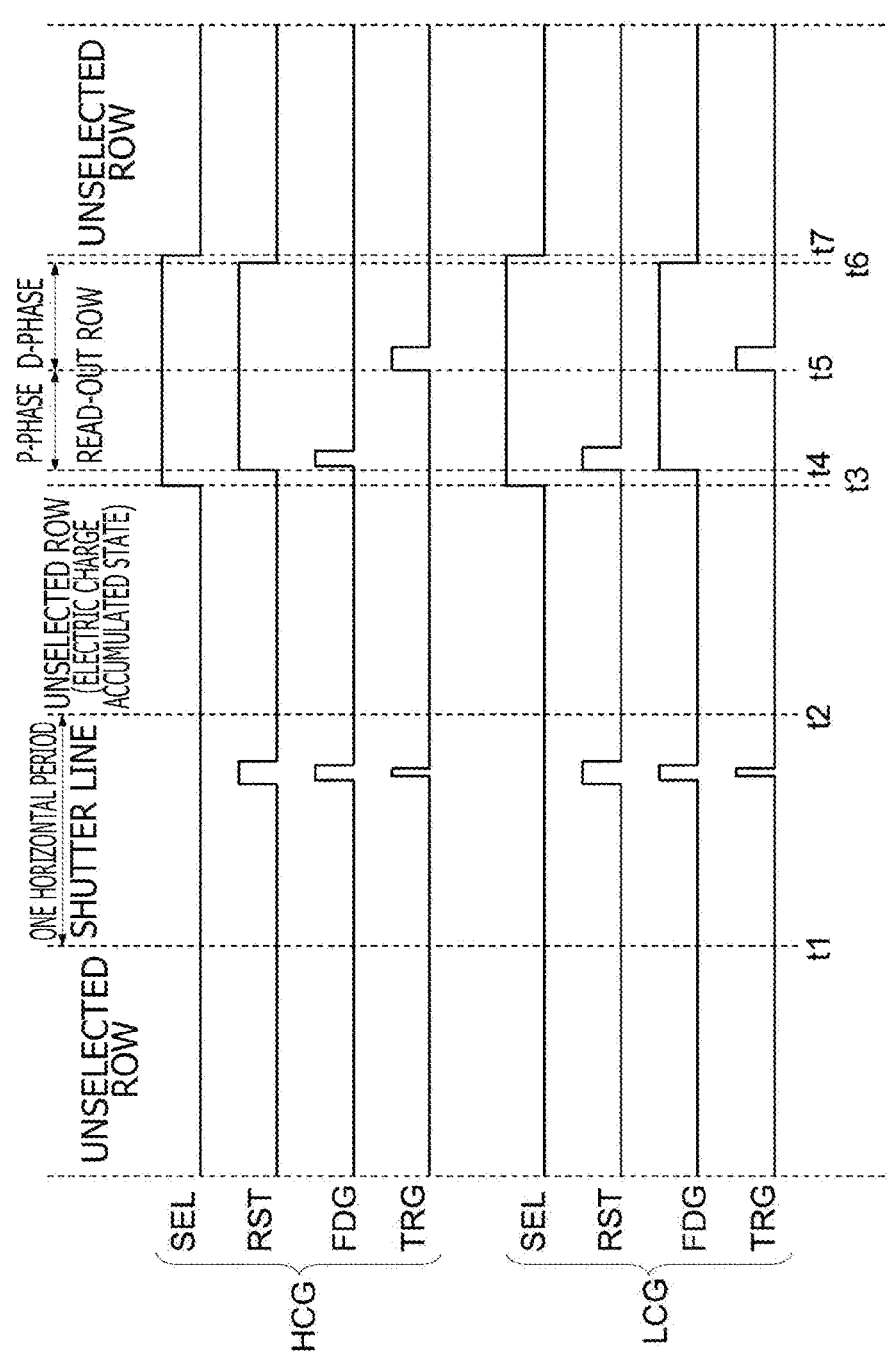
F I G . 3

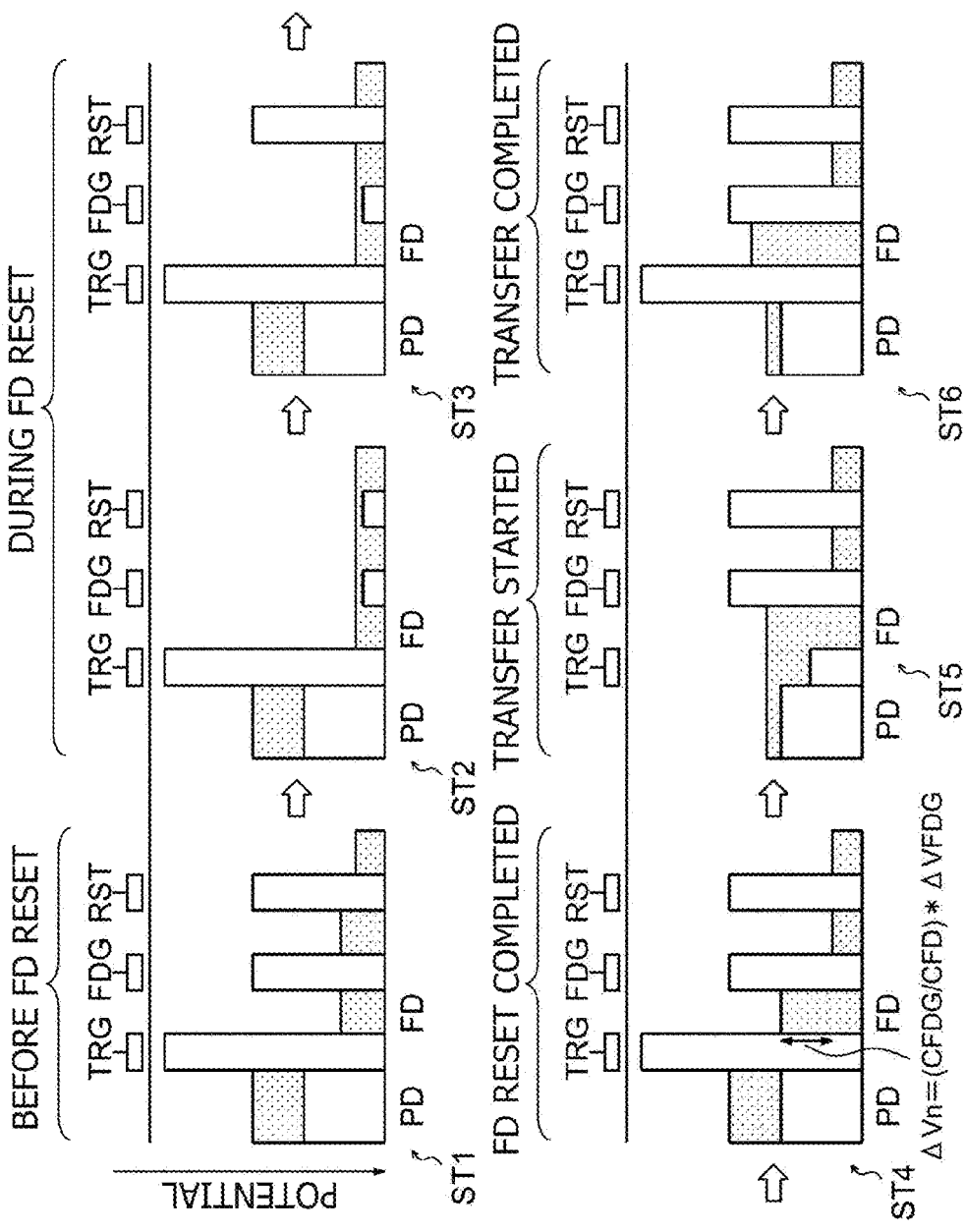
F I G . 6

F I G . 7
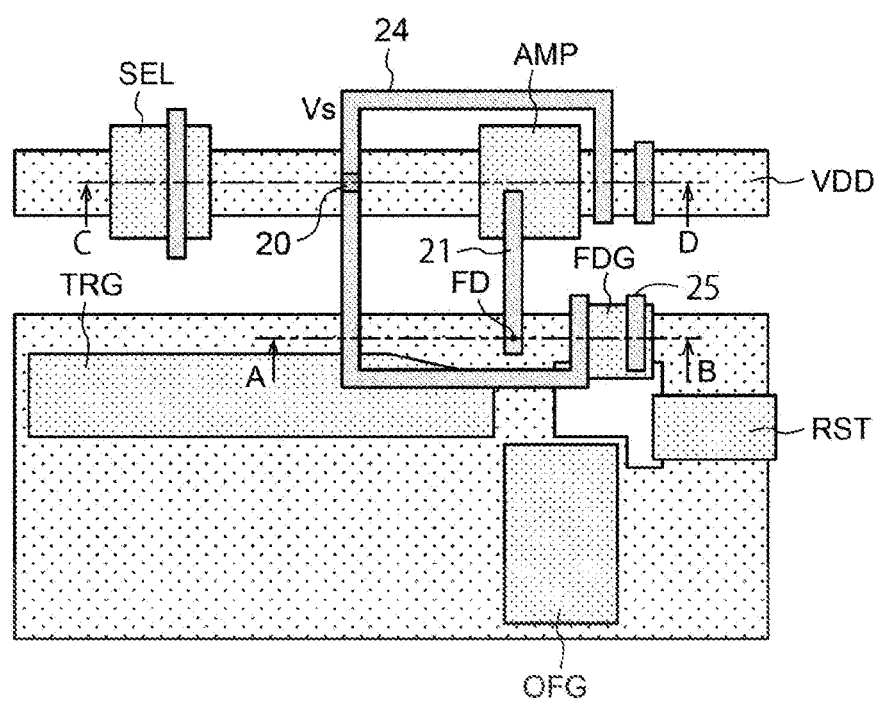

F I G . 9
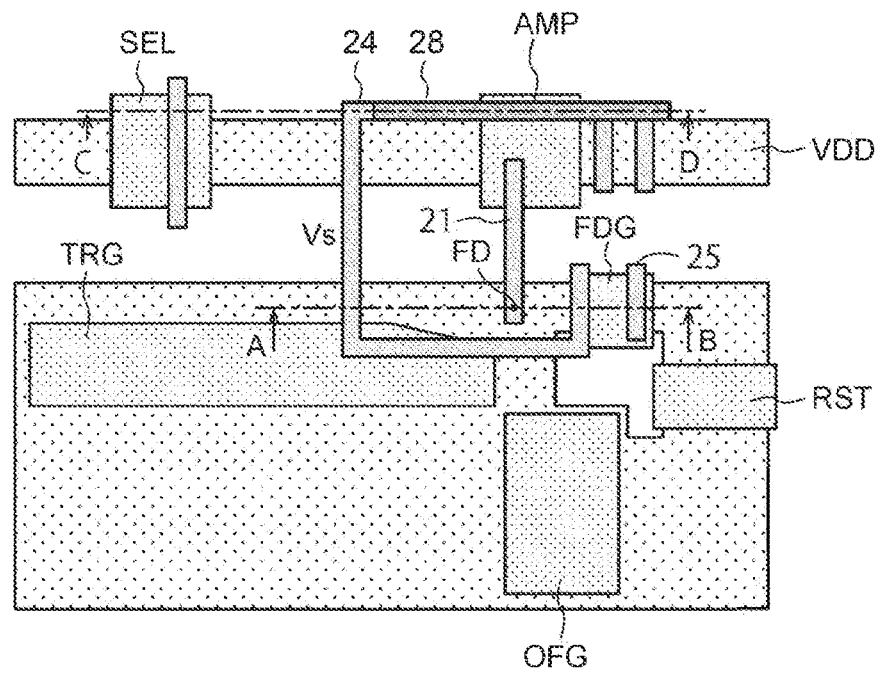
F I G . 1 0
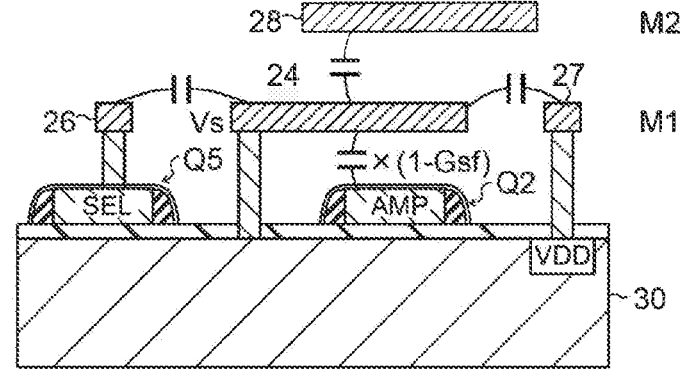

F I G . 1 1
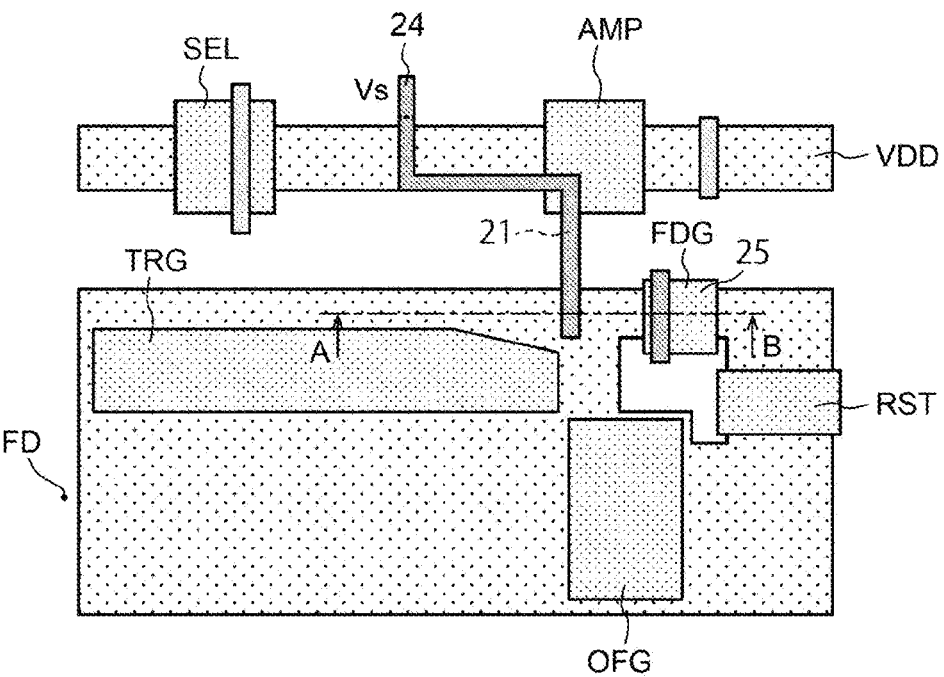
F I G . 1 2
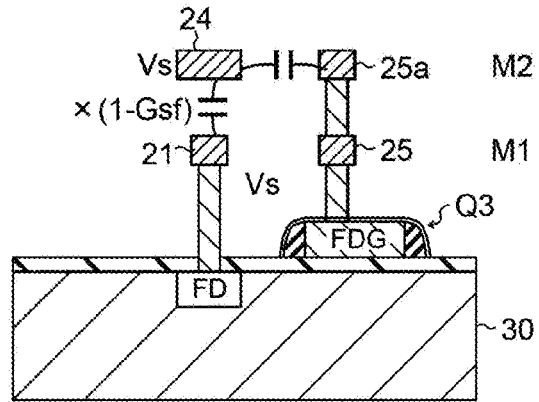

F I G . 1 8
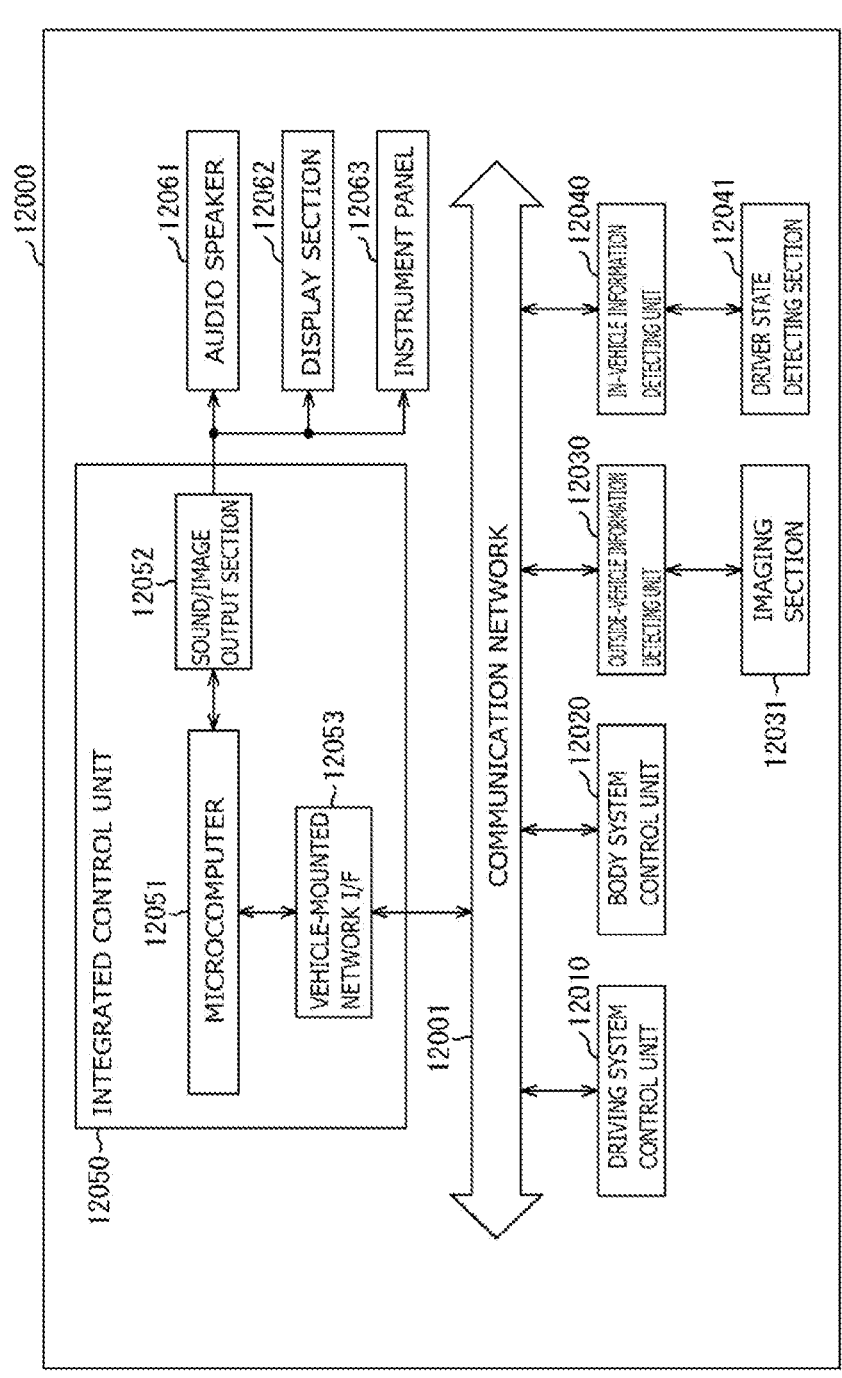

SOLID-STATE IMAGING DEVICE AND ELECTRONIC EQUIPMENT

CROSS REFERENCE TO RELATED APPLICATIONS

This application is a U.S. National Phase of International Patent Application No. PCT/JP2022/016641 filed on Mar. 31, 2022, which claims priority benefit of Japanese Patent Application No. JP 2021-127784 filed in the Japan Patent Office on Aug. 3, 2021. Each of the above-referenced applications is hereby incorporated herein by reference in its entirety.

TECHNICAL FIELD

The present disclosure relates to a solid-state imaging device and electronic equipment.

BACKGROUND ART

A previously proposed imaging device is capable of switching charge-voltage conversion gain of electric charge transmitted from a photodiode to a floating diffusion layer (refer to PTL 1). This type of imaging device includes a transistor for switching the charge-voltage conversion gain within a pixel (hereinafter referred to as the charge-voltage conversion gain switching transistor).

CITATION LIST

Patent Literature

[PTL 1]
PCT Patent Publication No. WO2016/199588

SUMMARY

Technical Problem

However, when the charge-voltage conversion gain switching transistor is provided in a pixel, the wiring connecting the floating diffusion layer to the gate of an amplification transistor (hereinafter this wiring is referred to as the FD wiring) is disposed near the gate of the charge-voltage conversion gain switching transistor. This increases capacitive coupling and may decrease the charge-voltage conversion gain.

Further, even in the case of a pixel without the charge-voltage conversion gain switching transistor, when pixel miniaturization progresses, the FD wiring is disposed near the gate of a reset transistor. This increases capacitive coupling and may similarly decrease the charge-voltage conversion gain.

The present disclosure has been made in view of the above circumstances, and provides a solid-state imaging device and electronic equipment that are capable of suppressing a charge-voltage conversion gain decrease due to FD wiring capacitive coupling.

Solution to Problem

In order to solve the above-described problem, according to the present disclosure, there is provided a solid-state imaging device including a photoelectric conversion section, a first transistor, a floating diffusion layer, a second transistor, a conductive layer, and a wiring layer. The photoelectric conversion section photoelectrically converts incident light and accumulates electric charge. The first transistor transfers the electric charge accumulated in the photoelectric conversion section. The floating diffusion layer retains the electric charge transferred by the first transistor. The second transistor amplifies the electric charge retained in the floating diffusion layer. The conductive layer conducts to the floating diffusion layer. The wiring layer causes capacitive coupling with the conductive layer and conducts to a source of the second transistor.

A potential of the wiring layer and a potential of the conductive layer may vary in conjunction with each other.

The wiring layer and the conductive layer may be disposed in a same layer with an insulating layer interposed therebetween.

The wiring layer may be disposed in a layer that, when compared to the conductive layer, is positioned closer to a substrate on which the photoelectric conversion section and the floating diffusion layer are disposed.

The solid-state imaging device may include a contact that extends in a stacking direction and connects the wiring layer to the source of the second transistor. The wiring layer may be disposed at a distance from conductive members other than the contact.

The wiring layer may be disposed to surround at least a portion of the conductive layer.

The conductive layer may include a first end connected to the floating diffusion layer and a second end connected to a gate of the second transistor.

The solid-state imaging device may include a third transistor that switches a charge-voltage conversion gain or initializes the electric charge of the floating diffusion layer. At least a portion of the wiring layer may be disposed between a gate of the third transistor and the conductive layer.

The wiring layer, a gate wiring layer connected to the gate of the third transistor, and the conductive layer may be disposed in a same layer with an insulating layer respectively interposed therebetween.

The wiring layer and the conductive layer may be disposed in different layers in the stacking direction with an insulating layer interposed therebetween. The wiring layer and the gate wiring layer connected to the gate of the third transistor may be disposed in the same layer with an insulating layer interposed therebetween.

The wiring layer and the conductive layer may be disposed in the same layer with an insulating layer interposed therebetween. The wiring layer and the gate wiring layer connected to the gate of the third transistor may be disposed in different layers in the stacking direction with an insulating layer interposed therebetween.

The layer in which the gate of the third transistor is disposed may be disposed in a layer that, when compared to the wiring layer and the conductive layer, is positioned closer to a substrate on which the photoelectric conversion section and the floating diffusion layer are disposed.

The wiring layer and the conductive layer may be disposed in a layer that, when compared to the gate wiring layer of the third transistor, is positioned closer to a substrate on which the photoelectric conversion section and the floating diffusion layer are disposed.

The conductive layer and the gate wiring layer of the third transistor may be disposed in the same layer with an insulating layer interposed therebetween. The wiring layer may be disposed in a layer different from the conductive layer and the gate wiring layer of the third transistor.

The wiring layer may be disposed in a layer that, when compared to the conductive layer and the gate wiring layer of the third transistor, is positioned closer to a substrate on which the photoelectric conversion section and the floating diffusion layer are disposed.

The solid-state imaging device may include a conductive member that is disposed in a layer different in a stacking direction from the wiring layer and a gate of the second transistor. The wiring layer may be disposed in a layer between the gate of the second transistor and the conductive member.

The solid-state imaging device may include a first capacitive element, a second capacitive element, a pre-stage circuit, a selection circuit, a post-stage reset transistor, and a post-stage circuit. The pre-stage circuit sequentially generates a predetermined reset level and a signal level based on an exposure amount, and causes the first and second capacitive elements to respectively retain the generated levels. The selection circuit sequentially performs control to connect one of the first and second capacitive elements to a predetermined post-stage node, control to disconnect both of the first and second capacitive elements from the post-stage node, and control to connect another one of the first and second capacitive elements to the predetermined post-stage node. The post-stage reset transistor initializes the level of the predetermined post-stage node when both of the first and second capacitive elements are disconnected from the predetermined post-stage node. The post-stage circuit sequentially reads out the reset level and the signal level from the first and second capacitive elements through the post-stage node, and outputs the read-out levels. The pre-stage circuit may include the photoelectric conversion section, the first transistor, the floating diffusion layer, the second transistor, the conductive layer, and the wiring layer.

According to the present disclosure, there may be provided electronic equipment including a solid-state imaging device and a signal processing section. The solid-state imaging device outputs a pixel signal that is obtained by photoelectrically converting light incident on a pixel area. The signal processing section performs signal processing based on the pixel signal. The solid-state imaging device includes a photoelectric conversion section, a first transistor, a floating diffusion layer, a second transistor, a conductive layer, and a wiring layer. The photoelectric conversion section photoelectrically converts incident light and accumulates electric charge. The first transistor transfers the electric charge accumulated in the photoelectric conversion section. The floating diffusion layer retains the electric charge transferred by the first transistor. The second transistor amplifies the electric charge retained in the floating diffusion layer. The conductive layer conducts to the floating diffusion layer. The wiring layer causes capacitive coupling with the conductive layer and conducts to a source of the second transistor.

BRIEF DESCRIPTION OF DRAWINGS

FIG. 3 is a timing diagram illustrating an imaging timing of a pixel.

FIG. 6 is a diagram illustrating a feedthrough.

FIG. 7 is a plane layout diagram illustrating a circuit section of a pixel according to a first embodiment.

FIG. 9 is a layout diagram according to a modification of FIG. 7.

FIG. 10 is a cross-sectional view taken along line C-D of FIG. 9.

FIG. 11 is a layout diagram illustrating a circuit section of a pixel according to a second embodiment.

FIG. 12 is a cross-sectional view taken along line A-B of FIG. 11.

FIG. 18 is a block diagram depicting an example of schematic configuration of a vehicle control system.

DESCRIPTION OF EMBODIMENTS

Embodiments of a solid-state imaging device and electronic equipment will now be described with reference to the accompanying drawings. The following description mainly deals with major component elements of the solid-state imaging device and electronic equipment. However, undepicted or undescribed component elements and functions may exist in the solid-state imaging device and the electronic equipment. The description given below does not exclude the undepicted or undescribed component elements and functions.

Figure 1:
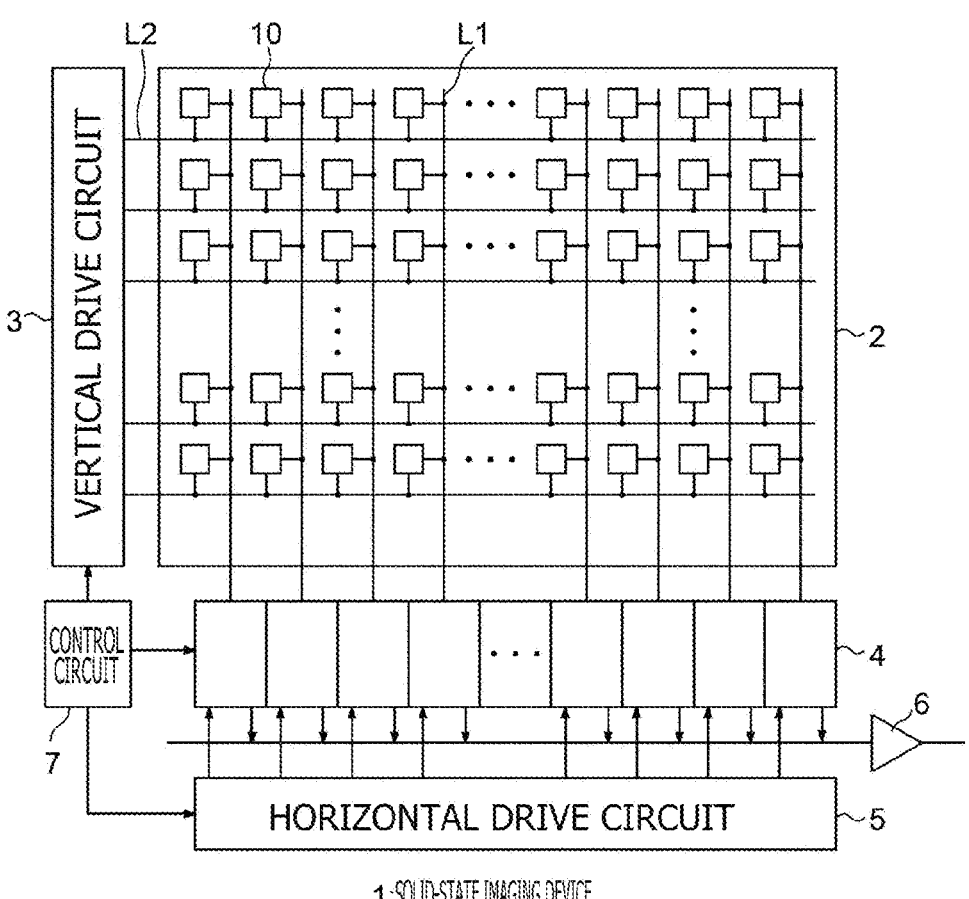
FIG. 1 is a block diagram illustrating an outline configuration of a solid-state imaging device according to an embodiment.

FIG. 1 is a block diagram illustrating an outline configuration of the solid-state imaging device 1 according to an embodiment of the present disclosure. The solid-state imaging device 1 depicted in FIG. 1 includes a pixel array section 2, a vertical drive circuit 3, a column signal processing circuit 4, a horizontal drive circuit 5, an output circuit 6, and a control circuit 7.

The pixel array section 2 includes multiple pixels 10, multiple signal lines L1, and multiple row selection lines L2. The multiple pixels are arranged in a row direction and in a column direction. The multiple signal lines L1 are extended in the column direction. The multiple row selection lines L2 are extended in the row direction.

The vertical drive circuit 3 drives the multiple row selection lines L2. More specifically, the vertical drive circuit 3 line-sequentially supplies a drive signal to the multiple row selection lines L2, and line-sequentially selects the individual row selection lines L2.

The column signal processing circuit 4 is connected to the multiple signal lines L1, which are extended in the column direction. The column signal processing circuit 4 performs analog-to-digital (AD) conversion on multiple pixel signals that are supplied through the multiple signal lines L1. More specifically, the column signal processing circuit 4 compares the pixel signal on each signal line L1 with a reference signal, and generates a digital pixel signal based on the time until the signal levels of the pixel signal and reference signal match. The column signal processing circuit 4 sequentially generates a digital pixel signal (P-phase signal) at the reset level of a floating diffusion layer in a pixel and a digital pixel signal (D-phase signal) at the pixel signal level, and performs CDS (Correlated Double Sampling).

The horizontal drive circuit 5 controls the timing at which an output signal of the column signal processing circuit 4 is transferred to the output circuit 6.

The control circuit 7 controls the vertical drive circuit 3, the column signal processing circuit 4, and the horizontal drive circuit 5. The control circuit 7 generates the reference signal that is used by the column signal processing circuit 4 to perform AD conversion.

Figure 2:
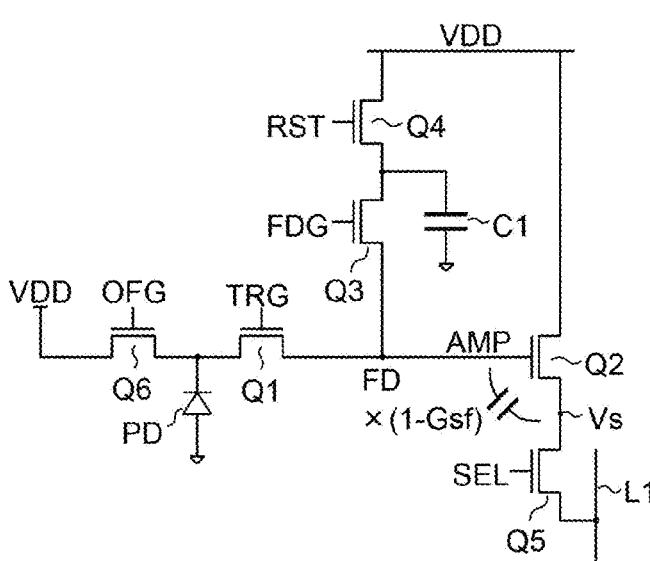
FIG. 2 is a circuit diagram of a pixel in a pixel array section.

FIG. 2 is a circuit diagram of a pixel 10 in the pixel array section 2. The pixel 10 depicted in FIG. 2 includes a photodiode PD, a floating diffusion layer FD (Floating Diffusion), a transfer transistor (first transistor) Q1, an amplification transistor (second transistor) Q2, a charge-voltage conversion gain switching transistor (hereinafter referred to as the gain switching transistor or the third transistor) Q3, a reset transistor (third transistor) Q4, a selection transistor Q5, and a discharge transistor Q6. The transistors Q1-Q6 in the pixel 10 are, for example, NMOS (N-channel Metal Oxide Semiconductor) transistors.

The photodiode PD accumulates electric charge that is obtained by photoelectrically converting incident light. The transfer transistor Q1 transfers the electric charge accumulated in the photodiode PD to floating diffusion layer FD when a transfer gate TRG is high. The gate AMP of the amplification transistor Q2 is set at a potential appropriate for the electric charge accumulated in the floating diffusion layer FD. The source of the amplification transistor Q2 is connected to the drain of the selection transistor Q5, and the source of the selection transistor Q5 is connected to the signal line L1. The amplification transistor Q2 and the selection transistor Q5 form a source follower circuit, and the potential of the signal line L1 varies with the potential of the floating diffusion layer FD.

The source of the gain switching transistor Q3 is connected to the floating diffusion layer FD, and the drain is connected to the source of the reset transistor Q4 and connected to one end of a pixel internal capacity C1. A conversion gain switching signal is inputted to the gate FDG of the gain switching transistor Q3. When the conversion gain switching signal goes high, the gain switching transistor Q3 turns on to parallelly connect the floating diffusion layer FD and the pixel internal capacity C1 and increase the capacity for accumulating the electric charge obtained by photoelectric conversion. This results in decreasing the conversion gain. When the gain switching transistor Q3 turns off, the electric charge obtained by photoelectric conversion is accumulated only in the floating diffusion layer FD, so that the conversion gain increases. When the gain switching transistor Q3 is on, an LCG (Low-Conversion-Gain) drive mode is invoked, and when the gain switching transistor Q3 is off, an HCG (High-Conversion-Gain) drive mode is invoked. The HCG drive mode is selected, for example, for image capturing in a dark place.

FIG. 3 is a timing diagram illustrating the imaging timing of a pixel. FIG. 3 depicts the on/off timing of the transistors Q1, Q2, 04, and Q5 in the pixel 10 in the HCG drive mode and in the LCG drive mode. The individual pixels 10 in the pixel array section 2 are driven row by row by a row selection signal. Periods of time between t1 and t2, between t2 and t3, and between t3 and t7, which are depicted in FIG. 3, each represent one horizontal period. One pixel row is read out within one horizontal period. FIG. 3 depicts the imaging timing of a specific pixel row.

A discharging operation is performed for a specific pixel row within one horizontal period between time t1 and time t2 in the HCG drive mode. First, the reset transistor Q4 is turned on for a predetermined period, the gain switching transistor Q3 is turned on while the reset transistor Q4 is on, and the transfer transistor Q1 is turned on while the gain switching transistor Q3 is on. The electric charge accumulated in the floating diffusion layer FD is then discharged to a power supply voltage node VDD through the gain switching transistor Q3 and the reset transistor Q4. Further, while the transfer transistor Q1 is on, the electric charge accumulated in the photodiode PD and the electric charge accumulated in the floating diffusion layer FD are discharged to the power supply voltage node VDD through the gain switching transistor Q3 and the reset transistor Q4. Subsequently, within one horizontal period between time t2 and time t3, electric charge accumulation is performed by photoelectric conversion of a specific pixel row.

Subsequently, pixel signals of a specific pixel row are read out to the signal line L1 within one horizontal period between time t3 and time t7. The gate signal SEL of the selection transistor Q5 is high during a period between time t3 and time t7. The gate FDG of the gain switching transistor Q3 is turned on for a predetermined period from time t4. The transfer transistor Q1 is off during a period between time t4 and time t5. In the HCG mode, the reset transistor Q4 remains on during a period between t4 and time t6, and the gain switching transistor Q3 is turned on for a predetermined period from time t4. As a result, during the period between time t4 and time t5, the electric charge accumulated in the floating diffusion layer FD is discharged to the power supply voltage node VDD, and the potential of the floating diffusion layer FD is at the reset level. The reset level of the floating diffusion layer FD is read out to the signal line L1 through the amplification transistor Q2 and the selection transistor Q5.

At time t5, the transfer gate TRG turns on and remains on for a predetermined period. During a period between time t5 and time t6, the reset transistor Q4 is on, but the gain switching transistor Q3 is off. Therefore, the electric charge obtained by photoelectric conversion performed by the photodiode PD is accumulated in the floating diffusion layer FD through the transfer transistor Q1. Therefore, the floating diffusion layer FD has a potential corresponding to the electric charge obtained by photoelectric conversion, and a pixel signal (D-phase signal) corresponding to the electric charge obtained by photoelectric conversion is read out to the signal line L1 during a period between time t5 and time t6.

Meanwhile, in the LCG drive mode, the timing of the period between time t3 and time t7 is different from that in the HCG drive mode. The reset transistor Q4 is turned on for a predetermined period from time t4, and the gain switching transistor Q3 remains on during a period between time t4 and time t6. As a result, during the period between time t4 and time t5, the P-phase signal is read out in a manner similar to that in the HCG drive mode. However, when the D-phase signal is subsequently read out, the electric charge obtained by photoelectric conversion performed by the photodiode PD is accumulated in the floating diffusion layer FD and in the pixel internal capacity C1. This increases an FD capacitance. Therefore, changes in the potential of the floating diffusion layer FD are suppressed, so that the gain by the amplification transistor Q2 is kept low.

In a pixel circuit depicted in FIG. 2, there is a risk that the wiring between the floating diffusion layer FD and the gate of the amplification transistor Q2 (hereinafter referred to as the FD wiring or the conductive layer) may cause capacitive coupling with the gate FDG of the gain switching transistor Q3.

Figure 4:
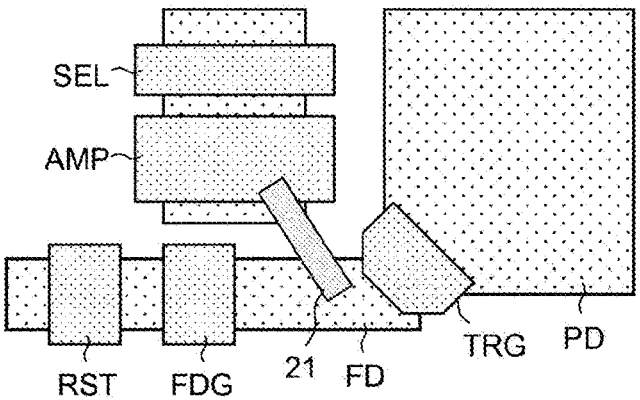
FIG. 4 is a layout diagram illustrating a circuit section of a pixel.

FIG. 4 is a layout diagram illustrating a circuit section of the pixel 10. As depicted in FIG. 4, the transfer gate TRG is disposed so as to straddle the photodiode PD and the floating diffusion layer FD. Further, the FD wiring 21 connected to the gate AMP of the amplification transistor Q2 and to the floating diffusion layer FD is disposed near the gate FDG of the gain switching transistor Q3. This causes capacitive coupling.

Figure 5A:
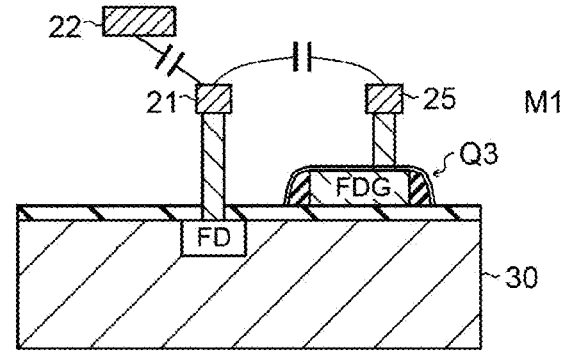
FIG. 5A is a cross-sectional view illustrating the vicinity of an FD wiring and of an amplification transistor.
Figure 5B:
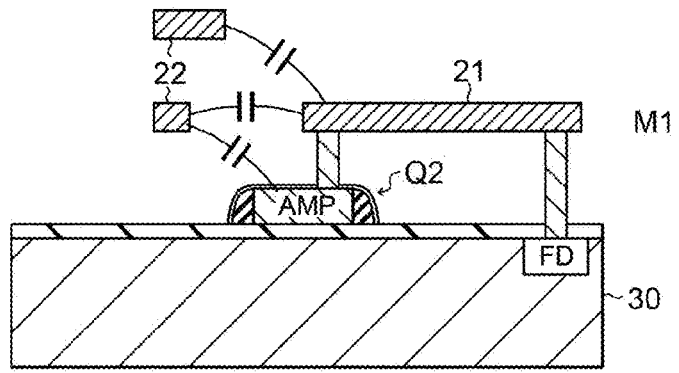
FIG. 5B is a cross-sectional view illustrating the vicinity of the FD wiring and of the gate of a gain switching transistor.

FIGS. 5A and 5B are schematic cross-sectional views illustrating the circuit section of the pixel 10. FIG. 5A depicts a cross-sectional structure near the FD wiring 21 and amplification transistor Q2. FIG. 5B depicts a cross-sectional structure near the FD wiring 21 and the gate FDG of the gain switching transistor Q3.

As depicted in FIG. 5A, the FD wiring 21 is disposed above the floating diffusion layer FD and the amplification transistor Q2, and is connected to the floating diffusion layer FD and the gate AMP of the amplification transistor Q2 through contacts, respectively. Other wiring layers 22 and conductive members are disposed near the FD wiring 21, so that capacitive coupling occurs between them.

Further, in a case where a wiring layer 25 connected to the gate FDG of the gain switching transistor Q3 is disposed near the FD wiring 21 as depicted in FIG. 5B, capacitive coupling occurs between the FD wiring 21 and the wiring layer 25. Furthermore, as is the case with FIG. 5A, the other wiring layers 22 and conductive members are disposed near the FD wiring 21, so that capacitive coupling occurs between them.

As described above, in the case of the layout depicted in FIG. 4, the total capacitance of the floating diffusion layer FD increases due to capacitive coupling of the FD wiring 21, so that the conversion gain decreases. Further, when the floating diffusion layer FD is reset, a feedthrough becomes large and induces a charge transfer failure. Particularly, in the HCG mode, since the total capacitance of the floating diffusion layer FD is originally small, the proportion of capacitive coupling in the FD capacitance becomes large to enlarge the feedthrough. Therefore, in order to achieve both low noise and charge transfer, it is desirable that the capacitive coupling between the FD wiring 21 and the gate wiring (FDG wiring) of the gain switching transistor Q3 be reduced.

FIG. 6 is a diagram illustrating the feedthrough and depicts the potential relation between the transfer transistor Q1, the gain switching transistor Q3, and the reset transistor Q4. The vertical axis in FIG. 6 represents the potential, and indicates that the lower the position along the vertical axis, the higher the potential. FIG. 6 depicts changes in a potential well that are caused by potential changes in the gate TRG of the transfer transistor Q1, the gate FDG of the gain switching transistor Q3, and the gate RST of the reset transistor Q4.

ST1 in FIG. 6 indicates the state of the floating diffusion layer FD before being reset. In this state, the gain switching transistor Q3 and the reset transistor Q4 are both off, and the transfer transistor Q1 is also off.

ST2 is a state where the floating diffusion layer FD is at the reset level. In this state, the gain switching transistor Q3 and the reset transistor Q4 are both on so the electric charge accumulated in the floating diffusion layer FD is discharged to the power supply voltage node VDD.

ST3 is a state where the reset transistor Q4 is turned off while the gain switching transistor Q3 is left on. ST2 and ST3 indicate operations that are performed during the resetting of the floating diffusion layer FD.

ST4 is a state where the reset operation of the floating diffusion layer FD is completed. In this state, the gain switching transistor Q3 and the reset transistor Q4 both turn off. If, in this state, capacitive coupling occurs between the FD wiring 21 and the gate wiring of the gain switching transistor Q3, the electric charge accumulated in the floating diffusion layer FD increases by the amount of capacitive coupling, so that the potential of the floating diffusion layer FD decreases by $\Delta Vn$ expressed in Equation (1) below.

[Math. 1]

$$\Delta V_n = \left(\frac{C_{FDG}}{C_{FD}}\right) \times \Delta V_{FDG} \tag{1}$$

In Equation (1), $C_{FD}$ is the capacitance of the FD wiring 21, $C_{FDG}$ is the capacitive coupling between the FD wiring 21 and the gate wiring of the gain switching transistor Q3, and $\Delta V_{FDG}$ is the amount of change in the gate potential of the gain switching transistor Q3.

ST5 is a state where charge transfer is started. In this state, the transfer transistor Q1 is turned on to transfer the electric charge accumulated in the photodiode PD is transferred to the floating diffusion layer FD. However, the electric charge accumulated in the floating diffusion layer FD is increased in ST4 by the amount of capacitive coupling. Therefore, the electric charge accumulated in the diffusion layer FD flows back to the photodiode PD. This is a phenomenon called feedthrough mentioned above.

ST6 is a state where charge transfer is ended. In this state, the transfer transistor Q1 is turned off. Since the electric charge accumulated in the floating diffusion layer FD flows back to the photodiode PD in ST5, a portion of electric charge that is not transferred to the floating diffusion layer FD remains in the photodiode PD.

As depicted in FIG. 6, when the FD wiring 21 causes capacitive coupling with other wiring layers or conductive members, the FD capacitance increases to decrease the efficiency of charge-voltage conversion and thus increase the feedthrough when the floating diffusion layer FD is reset. The measures to reduce the capacitive coupling of the FD wiring 21 are described below.

First Embodiment

Figure 8A:
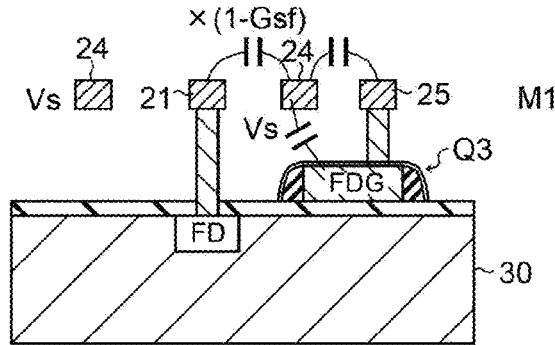
FIG. 8A is a cross-sectional view taken along line A-B of FIG. 7.
Figure 8B:
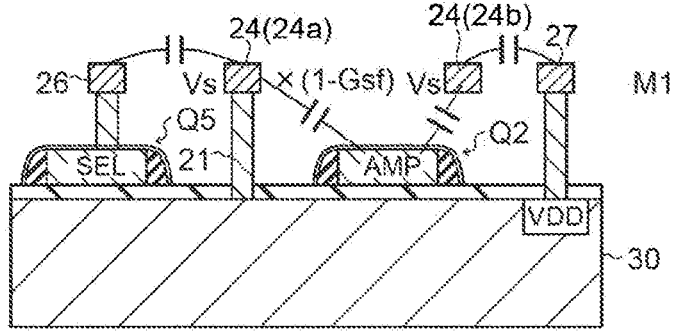
FIG. 8B is a cross-sectional view taken along line C-D of FIG. 7.

FIG. 7 is a plane layout diagram illustrating a circuit section of the pixel 10 according to a first embodiment. FIG. 8A is a cross-sectional view taken along line A-B of FIG. 7. FIG. 8B is a cross-sectional view taken along line C-D of FIG. 7.

As depicted in FIG. 7, the transfer gate TRG of the transfer transistor Q1, the gate FDG of the gain switching transistor Q3, and the gate RST of the reset transistor Q4 are disposed near the floating diffusion layer FD. The FD wiring 21 is disposed between the floating diffusion layer FD and the gate AMP of the amplification transistor Q2. The selection transistor Q5 is disposed near the amplification transistor Q2.

In the first embodiment, a new wiring layer (hereinafter referred to as the Vs wiring or the wiring layer) 24 is provided near the FD wiring 21 in order to cause capacitive coupling with the FD wiring 21 and conduct to the source of the gain switching transistor Q3. In the example of FIG. 7, the Vs wiring 24 is routed so as to surround the FD wiring 21. However, the layout need not necessarily be similar to the one depicted in FIG. 7.

As depicted in FIG. 7, the Vs wiring 24 conducts to the source of the amplification transistor Q2 through a contact 20 provided at one place. The Vs wiring 24 is not electrically connected to anything other than the contact 20. That is, the Vs wiring 24 is connected to the source of the single amplification transistor Q2 at only one point, and is routed around the FD wiring 21.

In the cross-section taken along line A-B of FIG. 7, as depicted in FIG. 8A, the Vs wiring 24 is disposed between the FD wiring 21 and the wiring layer (hereinafter referred to as the FDG wiring) 25 connected to the gate FDG of the gain switching transistor Q3. For this reason, capacitive coupling conventionally occurs between the FD wiring 21 and the FDG wiring 25. However, the present embodiment causes capacitive coupling not only between the FD wiring 21 and the Vs wiring 24 but also between the FDG wiring 25 and the Vs wiring 24. Referring to FIGS. 8A and 8B, the circumferences of the FD wiring 21, Vs wiring 24, and FDG wiring 25 are covered with an insulating layer.

Since the amplification transistor Q2 performs a source follower operation, the potential of the FD wiring 21 and the potential of the Vs wiring 24 change in conjunction with each other so that the capacitance due to capacitive coupling between the FD wiring 21 and the Vs wiring 24 is multiplied by $(1-\mathrm{Gst})$. Since a source follower gain Gst is approximately 0.8, the capacitance due to capacitive coupling between the FD wiring 21 and the Vs wiring 24 is sufficiently small.

When the Vs wiring 24 is disposed between the FD wiring 21 and the FDG wiring 25, it is possible to substantially shield against capacitive coupling between the FD wiring 21 and the FDG wiring 25, and thus reduce the capacitance of the floating diffusion layer FD (hereinafter referred to as the FD capacitance) to improve the efficiency of charge-voltage conversion. Further, according to the present embodiment, when the FD capacitance is reduced, the electric charge in the floating diffusion layer FD can be sufficiently discharged to the power supply voltage node VDD when the floating diffusion layer FD is reset. This results in a decrease in the feedthrough. Consequently, it is possible to not only reduce noise by increasing the conversion gain, but also suppress a transfer failure.

Referring to FIG. 8A, the Vs wiring 24 is disposed in the same wiring layer (e.g., M1 wiring layer) as the FD wiring 21 and the FDG wiring 25. However, the Vs wiring 24 may alternatively be disposed in a different wiring layer from the FD wiring 21 and the FDG wiring 25. As long as the Vs wiring 24 is disposed near the FD wiring 21 with the Vs wiring 24 disposed near the FDG wiring 25, the Vs wiring 24 may be disposed in any wiring region.

In the cross-sectional direction taken along line C-D of FIG. 7, as depicted in FIG. 8B, the VS wiring 24 is disposed between a wiring layer connected to the gate SEL of the selection transistor Q5 (hereinafter referred to as the SEL wiring) 26 and a wiring layer connected to the power supply voltage node VDD (hereinafter referred to as the VDD wiring) 27. The cross-sectional view depicted in FIG. 8B indicates that two separate pieces of Vs wiring 24 are disposed. However, in reality, a single piece of continuous Vs wiring 24 is disposed as depicted in FIG. 7. Two sections of the Vs wiring 24, which is separated by the cross-section depicted in FIG. 8B, are hereinafter referred to respectively as the first Vs wiring section 24a and the second Vs wiring section 24b.

If there is no Vs wiring 24, capacitive coupling occurs between the gate of the amplification transistor Q2, which has the same potential as the floating diffusion layer FD, and the wiring (VDD wiring 27) connected to the power supply voltage node VDD, and additionally occurs between the gate AMP of the amplification transistor Q2 and the wiring connected to the gate of the selection transistor Q5 (hereinafter referred to as the SEL wiring 26).

As depicted in FIG. 8B, when the Vs wiring 24 is disposed between the SEL wiring 26 and the VDD wiring 27, capacitive coupling occurs between the first Vs wiring section 24a and the SEL wiring 26, and capacitive coupling occurs between the first Vs wiring section 24a and the gate AMP of the amplification transistor Q2. Further, capacitive coupling occurs between the first Vs wiring section 24a and the gate AMP of the amplification transistor Q2, and capacitive coupling occurs between the second Vs wiring section 24b and the gate AMP of the amplification transistor Q2.

As depicted in FIG. 8B, the capacitance due to capacitive coupling between the gate AM of the amplification transistor Q2 and the first Vs wiring section 24a or the second Vs wiring section 24b is multiplied by $(1-\mathrm{Gsf})$. Since the source follower gain Gsf is approximately 0.8, each capacitive coupling described above has a small value.

Consequently, it is possible to shield against capacitive coupling between the SEL wiring 26 and the gate AMP of the amplification transistor Q2 and capacitive coupling between the VDD wiring 27 and the gate AMP of the amplification transistor Q2, and thus reduce the capacitance of the FD wiring 21.

Referring to FIG. 8B, the Vs wiring 24 is disposed in the same wiring layer (e.g., M1 wiring layer) as the SEL wiring 26 and the VDD wiring 27. However, the Vs wiring 24 may alternatively be disposed in a different wiring layer from the SEL wiring 26 and the VDD wiring 27. Nonetheless, the Vs wiring 24 needs to be disposed near the SEL wiring 26 and the VDD wiring 27.

It should be noted that considerable capacitive coupling occurs between a Vs node and the floating diffusion layer FD when the Vs wiring 24 is disposed as depicted in FIGS. 8A and 8B. Therefore, in order to maximize the effect of reducing the FD capacitance while shielding against the capacitive coupling between the FD wiring 21 and the other wirings, it is desirable that the distance between the Vs wiring 24 and the wirings to be shielded be minimized without violating design rules.

FIG. 9 is a layout diagram according to a modification of FIG. 7. FIG. 10 is a cross-sectional view taken along line C-D of FIG. 9. A conductive member 28, such as a wiring layer connected to other than the gate may be disposed above the gate of the amplification transistor. In such a case, capacitive coupling may occur between the gate of the amplification transistor Q2 and the conductive member 28, and thus increase the FD capacitance. Therefore, as depicted in FIG. 10, the Vs wiring 24 may be disposed between the gate of the amplification transistor Q2 and the conductive member 28, which is positioned above the gate of the amplification transistor Q2. In such a case, while capacitive coupling is allowed to occur between the Vs wiring 24 and the gate of the amplification transistor Q2, it is possible to shield against the capacitive coupling between the gate of the amplification transistor Q2 and the conductive member 28, and thus reduce the FD capacitance.

As is obvious from a comparison between FIGS. 9 and 7, a portion of the Vs wiring 24 is shifted to match the position of the conductive member 28 as depicted in FIG. 9. It is desirable that the Vs wiring 24 depicted in FIG. 10 be disposed so as to overlap the conductive member 28 when viewed from above.

In the example of FIG. 10, the Vs wiring 24 is disposed in the same wiring layer (e.g., M1 wiring layer) as the SEL wiring 26 and the VDD wiring 27. However, the Vs wiring 24 may alternatively be disposed in a different wiring layer from the SEL wiring 26 and the VDD wiring 27.

As described above, in the first embodiment, the Vs wiring 24 connected to the source of the amplification transistor Q2 is newly provided, and routed and disposed between the FD wiring 21 and the FDG wiring 25. Therefore, it is possible to shield against the capacitive coupling between the FD wiring 21 and the FDG wiring 25, and thus reduce the FD capacitance. Further, in the first embodiment, the Vs wiring 24 is not only disposed between the gate AMP of the amplification transistor Q2 and the VDD wiring 27, but also disposed between the gate AMP of the amplification transistor Q2 and the SEL wiring 26. Consequently, the FD capacitance can be further reduced. As described above, in the first embodiment, the Vs wiring 24 is routed so as to reduce the FD capacitance and sufficiently discharge the electric charge in the floating diffusion layer FD to the power supply voltage node VDD when the floating diffusion layer FD is reset. This reduces the feedthrough and makes it possible to suppress the transfer failure while reducing noise by increasing the conversion gain.

Second Embodiment

The first embodiment has been described with reference to an example in which the Vs wiring 24 is disposed in the same wiring layer as the FD wiring 21 and the FDG wiring 25. However, as an alternative, it is possible to shield the FD wiring 21 by disposing the Vs wiring 24 in a wiring layer region having a height different from that of the FD wiring 21.

FIG. 11 is a layout diagram illustrating the circuit section of the pixel 10 according to a second embodiment. FIG. 12 is a cross-sectional view taken along line A-B of FIG. 11. As depicted in FIGS. 11 and 12, the Vs wiring 24 is disposed above the FD wiring 21. If there is no Vs wiring 24, the FD wiring 21 causes capacitive coupling with the FDG wiring 25. However, when the Vs wiring 24 is disposed above the FD wiring 21 as depicted in FIG. 12, capacitive coupling occurs between the FD wiring 21 and the Vs wiring 24. This makes it possible to shield against the capacitive coupling between the FD wiring 21 and the FDG wiring 25.

When the Vs wiring 24 is merely disposed above the FD wiring 21, the Vs wiring 24 may not cause capacitive coupling with the FDG wiring 25. Therefore, when, as depicted in FIG. 12, the FDG wiring 25 has a two-layer structure with the upper wiring layer 25a disposed in the same wiring region (e.g., M2 wiring layer) as the Vs wiring 24, the upper wiring layer 25a and the Vs wiring 24 can cause capacitive coupling. As a result, it is possible to further shield against the capacitive coupling between the FD wiring 21 and the FDG wiring 25.

By disposing the Vs wiring 24 above the FD wiring 21, it is possible to shield against the capacitive coupling between the FD wiring 21 and the conductive members disposed above the Vs wiring 24.

Referring to FIG. 11, the FD wiring 21 and the FDG wiring 25 are disposed in the M1 wiring layer, and the Vs wiring 24 is disposed in the M2 wiring layer. However, a place where an MD wiring layer and the FDG wiring 25 are disposed and a place where the Vs wiring 24 is disposed are not necessarily limited to the M1 wiring layer and the M2 wiring layer.

As described above, in the second embodiment, the Vs wiring 24 is disposed above the FD wiring 21 instead of being disposed in the same wiring layer as the FD wiring 21. This makes it possible to substantially shield the FD wiring 21 and thus achieve the effect of shielding against capacitive coupling between the FD wiring 21 and the FDG wiring 25.

Third Embodiment

The first and second embodiments have been described with reference to an example in which the FD wiring 21 is disposed in the M1 wiring layer. However, the FD wiring 21 may alternatively be positioned closer to a semiconductor substrate 30 than the M1 wiring layer. In this document, for the sake of convenience, a wiring layer positioned closer to the semiconductor substrate 30 than the M1 wiring layer is referred to as the local wiring layer LW.

The photodiode PD and the floating diffusion layer FD are disposed on the semiconductor substrate 30. The circuit of the pixel 10 is disposed on the front surface of the semiconductor substrate 30. In the third embodiment, the local wiring layer LW is provided at a position near the front surface of the semiconductor substrate 30.

When the FD wiring 21 is disposed in the local wiring layer LW, the distance from the other wiring layers is increased to reduce capacitive coupling. Meanwhile, the distance from the gate of a transistor positioned close to the FD wiring 21 becomes shorter so as to significantly increase the capacitive coupling with this transistor.

Further, since the local wiring layer LW is positioned close to the semiconductor substrate 30, a ground capacitance cannot be ignored. Therefore, in the third embodiment, the Vs wiring 24 is provided in the local wiring layer LW near the FD wiring 21 to cause capacitive coupling with the FD wiring 21.

Figure 13:
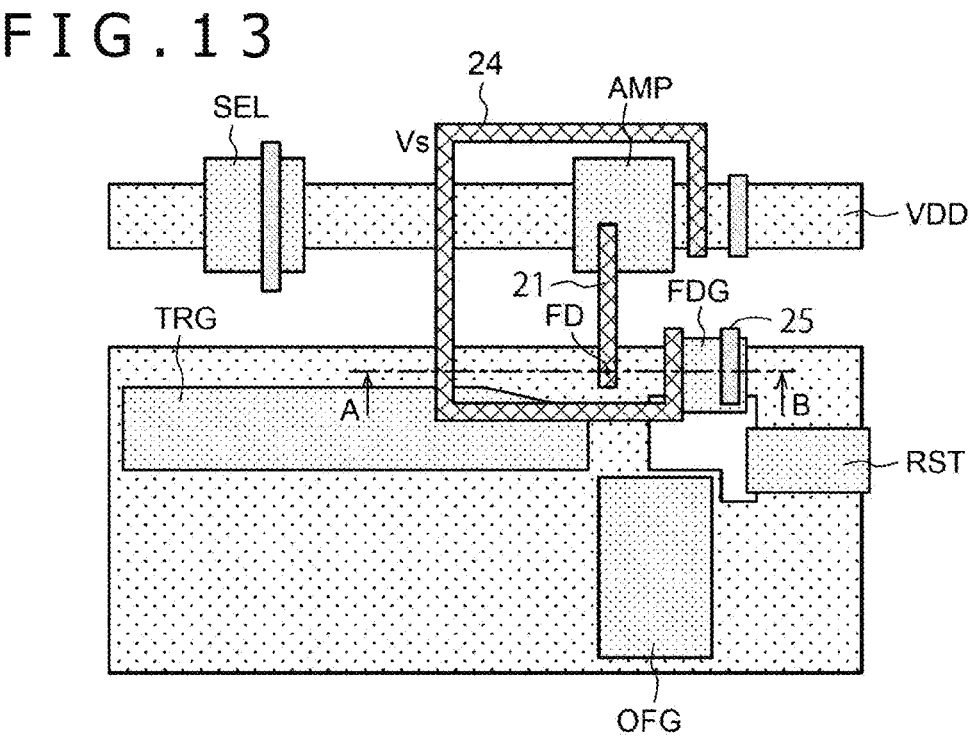
FIG. 13 is a layout diagram illustrating a circuit section of a pixel according to a third embodiment.
Figure 14:
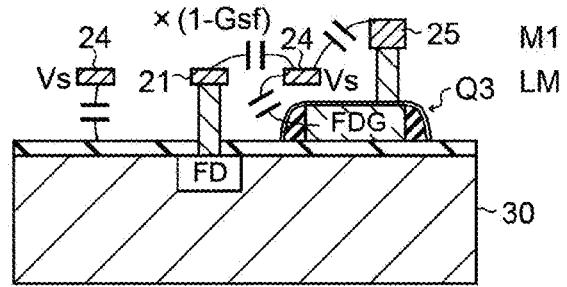
FIG. 14 is a cross-sectional view taken along line A-B of FIG. 13.

FIG. 13 is a layout diagram illustrating the circuit section of the pixel 10 according to the third embodiment. FIG. 14 is a cross-sectional view taken along line A-B of FIG. 13. As depicted in FIG. 13, the Vs wiring 24 according to the third embodiment has a plane layout that is almost the same as the Vs wiring 24 depicted in FIG. 7. However, as depicted in FIG. 14, the Vs wiring 24 according to the third embodiment is disposed in the local wiring layer LW, which is closer to the semiconductor substrate 30 than the M1 wiring layer. The FD wiring 21 is also disposed in the local wiring layer LW. The Vs wiring 24 is disposed between the FD wiring 21 and the gate of the gain switching transistor Q3. Therefore, the FD wiring 21 and the Vs wiring 24 cause capacitive coupling, and the Vs wiring 24 and the FDG wiring 25 additionally cause capacitive coupling. This makes it possible to shield against the capacitive coupling between the FD wiring 21 and the gate of the gain switching transistor Q3.

It is desirable that the Vs wiring 24 be disposed as close as possible to the FD wiring 21. When the Vs wiring 24 is positioned close to the FD wiring 21, capacitive coupling definitely occurs between the Vs wiring 24 and the FD wiring 21. Further, it is desirable that the Vs wiring 24 be disposed as close as possible to the gate of the gain switching transistor Q3 and the FDG wiring 25. When the Vs wiring 24 is positioned close to the gate of the gain switching transistor Q3 and the FDG wiring 25, the Vs wiring 24 definitely causes capacitive coupling between the gate of the gain switching transistor Q3 and the FDG wiring 25.

Figure 15:
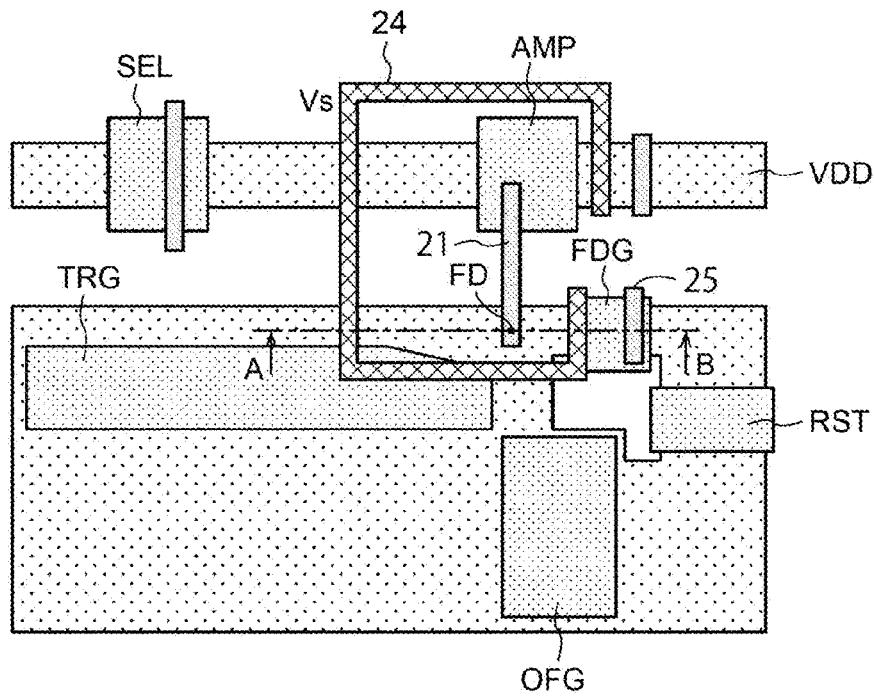
FIG. 15 is a layout diagram according to a modification of FIG. 13.
Figure 16:
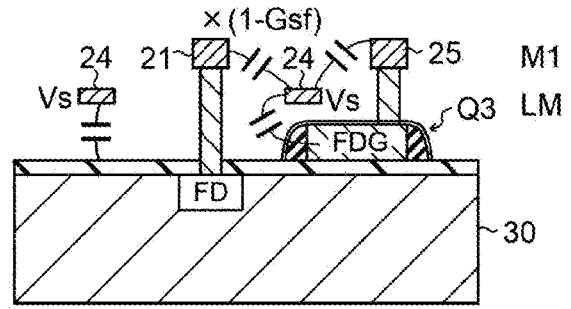
FIG. 16 is a cross-sectional view taken along line A-B of FIG. 15.

FIG. 15 is a layout diagram according to a modification of FIG. 13. FIG. 16 is a cross-sectional view taken along line A-B of FIG. 15. As depicted in FIG. 16, the layout depicted in FIG. 15 is similar to the layout depicted in FIG. 14 in that the Vs wiring 24 is provided in the local wiring layer LW. However, these layouts differ from each other in that the FD wiring 21 is disposed in the M1 wiring layer. Even in the case of FIG. 16, the Vs wiring 24 not only causes capacitive coupling with the FD wiring 21, but also causes capacitive coupling with the gate of the gain switching transistor Q3 and with an FDG gate.

The wiring layers included in the circuit of the pixel 10 are formed in existing wiring layers such as the M1 wiring layer and the M2 wiring layer. In contrast, when only the newly provided Vs wiring 24 is formed in the local wiring layer LW, it is possible to form the Vs wiring 24 without affecting the existing circuit layout of the pixel 10 and thus reduce the FD capacitance.

It should be noted that, as a further modification of the layout depicted in FIG. 15, the FD wiring 21 may be disposed in the local wiring layer LW with the Vs wiring 24 disposed in the M1 wiring layer. Even in this case, the FD capacitance can be reduced because the Vs wiring 24 and the FD wiring 21 cause capacitive coupling.

As described above, the third embodiment is able to cause capacitive coupling between the FD wiring 21 and the Vs wiring 24 by providing the Vs wiring 24 and the FD wiring 21 in the local wiring layer LW, which is positioned closer to the semiconductor substrate 30 than the existing wiring layers such as the M1 wiring layer and the M2 wiring layer. This makes it possible to reduce the FD capacitance. Further, since the FD capacitance is reduced, the electric charge in the floating diffusion layer FD can be sufficiently discharged to the power supply voltage node VDD when the floating diffusion layer FD is reset. As a result, the feedthrough can be reduced.

Fourth Embodiment

The first to third embodiments have been described with reference to an example in which the pixel 10 includes the gain switching transistor Q3. However, in a case where the gain switching transistor Q3 does not exist in the pixel 10, capacitive coupling may occur between the FD wiring 21 and the wiring connected to the gate of the reset transistor Q4 (hereinafter referred to as the RST wiring). In this case, when the above-mentioned Vs wiring 24 is disposed between the FD wiring 21 and the RST wiring, capacitive coupling occurs between the FD wiring 21 and the Vs wiring 24 and between the RST wiring and the Vs wiring 24. This makes it possible to shield against the capacitive coupling between the FD wiring 21 and the Vs wiring 24 and thus reduce the FD capacitance. Further, when the FD capacitance is reduced, the electric charge in the floating diffusion layer FD can be discharged to the power supply voltage node VDD when the floating diffusion layer FD is reset. As a result, the feedthrough can be reduced.

Fifth Embodiment

The solid-state imaging device according to a fifth embodiment is characterized in that it adopts a global shutter method. The global shutter method allows all pixels in the pixel array section 2 to become exposed at the same timing, store a P-phase signal level and a D-phase signal level in the pixels 10, and sequentially output digital signals representing the difference between the stored P-phase signal level and D-phase signal level. The use of the global shutter method prevents captured images from being distorted due to discrepancy in exposure timing.

Figure 17:
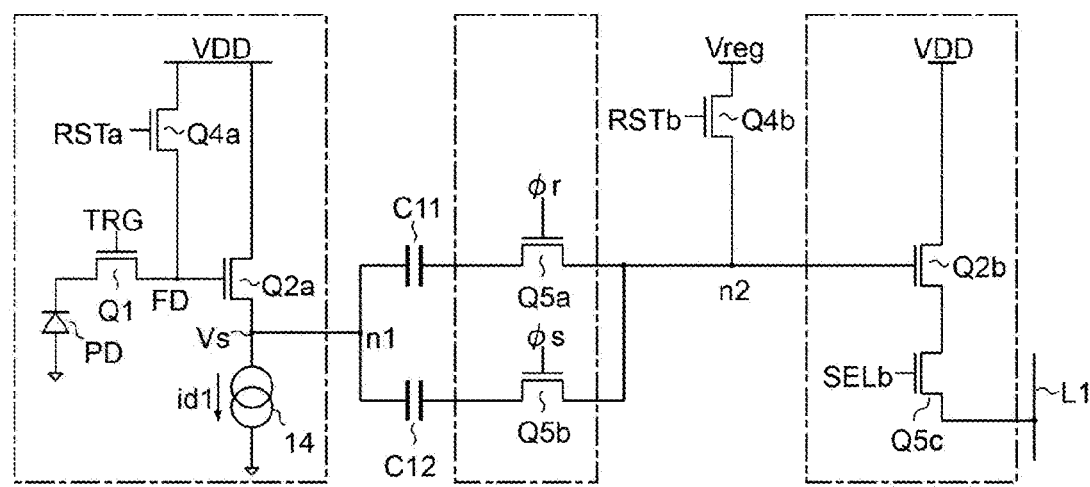
FIG. 17 is a circuit diagram illustrating an example configuration of a pixel in a fifth embodiment.

FIG. 17 is a circuit diagram illustrating an example configuration of a pixel 10 in the fifth embodiment of the present disclosure. In the circuit depicted in FIG. 17, circuit elements having the same functions as those depicted in FIG. 2 are designated by the same reference signs. The pixel 10 depicted in FIG. 17 includes a pre-stage circuit 11, capacitive elements C11 and C12, a selection circuit 12, a post-stage reset transistor Q4*b*, and a post-stage circuit 13.

The pre-stage circuit 11 includes a photoelectric conversion element PD, the transfer transistor Q1, the floating diffusion layer FD, a reset transistor Q4*a*, a pre-stage amplification transistor Q2, and a current source 14.

The photoelectric conversion element PD generates electric charge by photoelectric conversion. The transfer transistor Q1 transfers the electric charge from the photoelectric conversion element PD to the floating diffusion layer FD according to a transfer signal TRG from the vertical drive circuit 3.

The reset transistor Q4*a* performs initialization by extracting the electric charge from the floating diffusion layer FD according to an FD reset signal RSTa from the vertical drive circuit 3. The floating diffusion layer FD accumulates the electric charge, and generates a voltage based on the amount of electric charge. The pre-stage amplification transistor Q2 amplifies the voltage of the floating diffusion layer FD, and outputs the amplified voltage to a pre-stage node n1.

The drain of the reset transistor Q4*a* and the drain of the pre-stage amplification transistor Q2 are connected to a power supply voltage VDD. The current source 14 is connected to the source of the pre-stage amplification transistor Q2. The current source 14 supplies an electric current id1 under the control of the vertical drive circuit 3.

One end of each of the capacitive elements C11 and C12 is commonly connected to the pre-stage node n1, and the other end of each is connected to the selection circuit 12. The selection circuit 12 includes a selection transistor Q5*a* and a selection transistor Q5*b*. The selection transistor Q5*a* opens and closes the path between the capacitive element C11 and a post-stage node n2 according to a selection signal φr from the vertical drive circuit 3. The selection transistor Q5*b* opens and closes the path between the capacitive element C12 and the post-stage node n2 according to a selection signal φs from the vertical drive circuit 3.

The post-stage reset transistor Q4*b* initializes the level of the post-stage node n2 to a predetermined potential Vreg according to a post-stage reset signal RSTb from the vertical drive circuit 3. The predetermined potential Vreg is set to a potential different from a power supply potential VDD (e.g., a potential lower than VDD).

The post-stage circuit 13 includes a post-stage amplification transistor Q2*b* and a post-stage selection transistor Q5*c*. The post-stage amplification transistor Q2*b* increases the level of the post-stage node n2. The post-stage selection transistor Q5*c* outputs a signal at the level increased by the post-stage amplification transistor Q2*b* to the vertical signal line L1 as a pixel signal according to a post-stage selection signal SELb from the vertical drive circuit 3. It should be noted that the post-stage amplification transistor is an example of a second amplification transistor described in the appended claims.

Although each transistor in the pixel 10 depicted in FIG. 17 may be of any conductivity type, does not matter, in this specification, this document describes an example in which each transistor in the pixel 10 is an NMOS transistor.

The vertical drive circuit 3 supplies the FD reset signal RSTa and the transfer signal TRG, which are at a high level, to all pixels at the start of exposure. As a result, the photoelectric conversion element PD is initialized. This control is hereinafter referred to as the "PD reset."

Subsequently, immediately before the end of exposure, the vertical drive circuit 3 sets the post-stage reset signal RSTb and selection signal φr at the high level for all pixels, and supplies the FD reset signal RSTa at the high level for a pulse period. As a result, the floating diffusion layer FD is initialized, and a level corresponding to the level of the floating diffusion layer FD at that time is retained in the capacitive element C11. This control is hereinafter referred to as the "FD reset."

The level of the floating diffusion layer FD at the time of FD reset and a level corresponding to that level (the retention level of the capacitive element C11 and the level of the vertical signal line L1) are hereinafter collectively referred to as the "P phase" or the "reset level."

At the end of exposure, the vertical drive circuit 3 sets the post-stage reset signal RSTb and the selection signal φs at the high level for all pixels, and supplies the transfer signal TRG at the high level for the pulse period. As a result, signal charge based on the exposure amount is transferred to the floating diffusion layer FD, and a level corresponding to the level of the floating diffusion layer FD at that time is retained in the capacitive element C12.

The level of the floating diffusion layer FD at the time of signal charge transfer and a level corresponding to that level (the retention level of the capacitive element C12 and the level of the vertical signal line L1) are hereinafter collectively referred to as the "D phase" or the "signal level."

As described above, the pixel 10 depicted in FIG. 17 employs the global shutter method in which exposure of all pixels starts and ends at the same time. Under such exposure control, the pre-stage circuit 11 of all pixels sequentially generates the reset level and the signal level. The reset level is retained in the capacitive element C11, and the signal level is retained in the capacitive element C12.

After the end of exposure, the vertical drive circuit 3 sequentially selects rows and sequentially outputs the reset level and signal level of the selected rows. When outputting the reset level, the vertical drive circuit 3 sets the FD reset signal RSTa and post-stage selection signal SELb of the selected rows at the high level, and supplies the selection signal φr at the high level for a predetermined period. As a result, the capacitive element C11 is connected to the post-stage node n2 to read the reset level.

After the reset level is read out, the vertical drive circuit 3 keeps the FD reset signal RSTa and post-stage selection signal SELb of the selected rows at the high level, and supplies the post-stage reset signal RSTb at the high level for the pulse period. As a result, the level of the post-stage node n2 is initialized. In this instance, the selection transistor Q5a and the selection transistor Q5b are both in an open state, and the capacitive elements C11 and C12 are disconnected from the post-stage node n2.

After the post-stage node n2 is initialized, the vertical drive circuit 3 keeps the FD reset signal RSTa and the post-stage selection signal SELb of the selected rows at the high level, and supplies the selection signal φs at the high level for a predetermined period. As a result, the capacitive element C12 is connected to the post-stage node n2 to read out the signal level.

Under read-out control described above, the selection circuit 12 in a selected row sequentially performs control to connect the capacitive element C11 to the post-stage node n2, control to disconnect the capacitive elements C11 and C12 from the post-stage node n2, and control to connect the capacitive element C12 to the post-stage node n2. Further, when the capacitive elements C11 and C12 are disconnected from the post-stage node n2, the post-stage reset transistor Q4b in the selected row initializes the level of the post-stage node n2. Furthermore, the post-stage circuit 13 in the selected row sequentially reads out the reset level and the signal level from the capacitive elements C11 and C12 through the post-stage node n2, and outputs the read-out levels to the vertical signal line L1.

Moreover, in the pixel 10 depicted in FIG. 17, as is the case with FIGS. 7, 8A, and 8B, the Vs wiring 24 connected to the source of a pre-stage amplification transistor Q2a is disposed to surround the FD wiring 21 connected to the floating diffusion layer FD and the gate of the pre-stage amplification transistor Q2a, and disposed between the FD wiring 21 and the gate wiring of the reset transistor Q4a. This makes it possible to shield against the capacitive coupling between the FD wiring 21 and the FDG wiring 25, and thus reduce the FD capacitance. It should be noted that the pixel 10 depicted in FIG. 17 is not provided with a gain switching transistor. However, the gain switching transistor may be provided for the pixel 10. When the gain switching transistor is provided, the FD capacitance can be reduced by disposing the Vs wiring 24 between the gate wiring of the gain switching transistor and the FD wiring 21.

<Examples of Application to Mobile Bodies>

The technology according to the present disclosure (the present technology) is applicable to various products. For example, the technology according to the present disclosure may be implemented as an apparatus that is to be mounted in one of various types of mobile bodies such as automobiles, electric vehicles, hybrid electric vehicles, motorcycles, bicycles, personal mobility devices, airplanes, drones, ships, and robots.

FIG. 18 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 18, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 18, an audio speaker 12061, a display section 12062, and an instrument panel 12063 are illustrated as the output device. The display section 12062 may, for example, include at least one of an on-board display and a head-up display.

Figure 19:
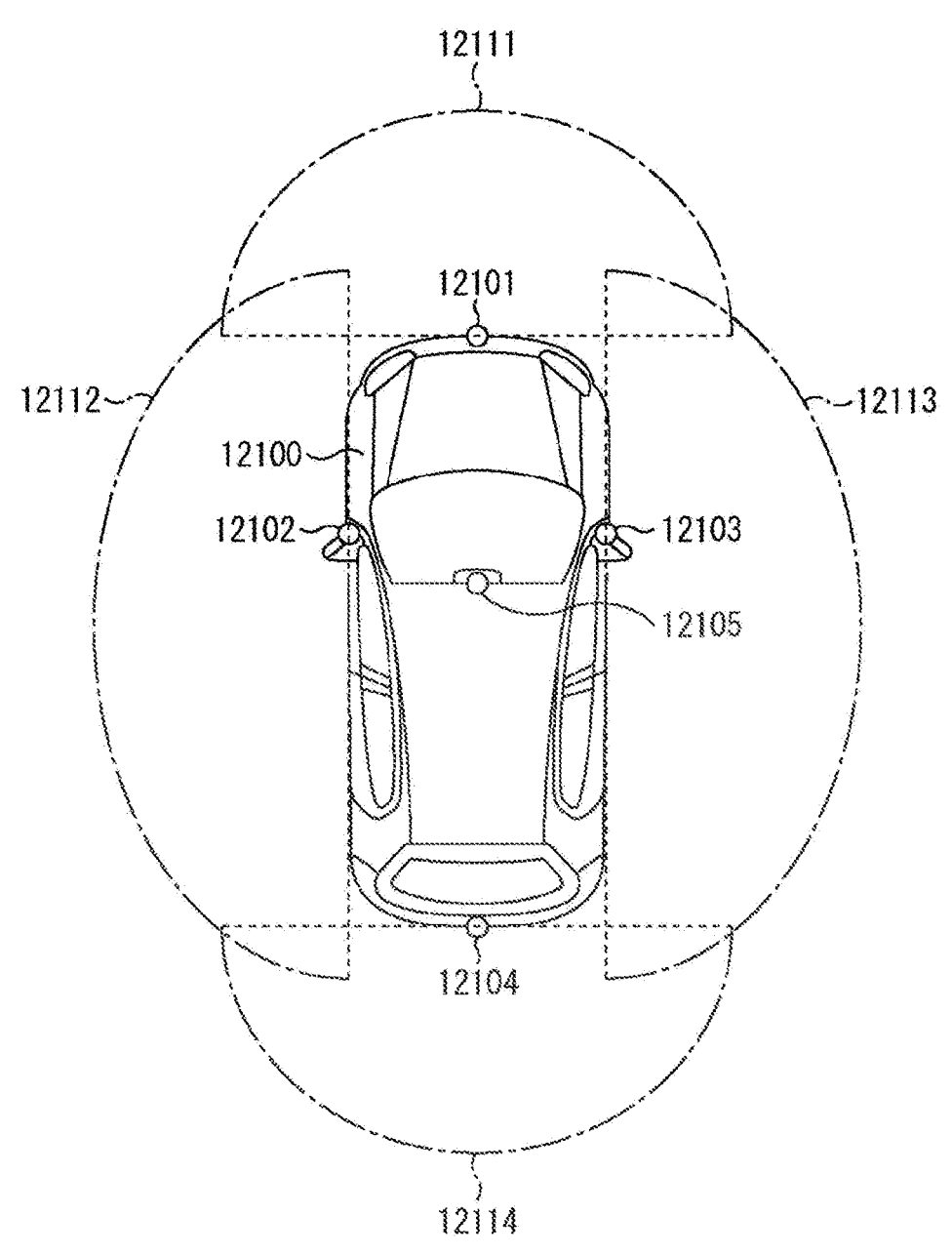
FIG. 19 is a diagram of assistance in explaining an example of installation positions of an outside-vehicle information detecting section and an imaging section.

FIG. 19 is a diagram depicting an example of the installation position of the imaging section 12031.

In FIG. 19, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 19 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described above. The technology according to the present disclosure can be applied to the imaging section 12031 and some other component elements described above. More specifically, the solid-state imaging device 1 according to the present disclosure can be applied to the imaging section 12031. When the technology according to the present disclosure is applied to the imaging section 12031, clearer captured images can be obtained so as to reduce driver fatigue.

Note that the present technology may be implemented in such following configurations.

(1)

A solid-state imaging device including:

a photoelectric conversion section that photoelectrically converts incident light and accumulates electric charge;

a first transistor that transfers the electric charge accumulated in the photoelectric conversion section;

a floating diffusion layer that retains the electric charge transferred by the first transistor;

a second transistor that amplifies the electric charge retained in the floating diffusion layer;

a conductive layer that conducts to the floating diffusion layer; and a wiring layer that causes capacitive coupling with the conductive layer and conducts to a source of the second transistor.

(2)

The solid-state imaging device according to (1), in which a potential of the wiring layer and a potential of the conductive layer vary in conjunction with each other.

(3)

The solid-state imaging device according to (1) or (2), in which the wiring layer and the conductive layer are disposed in a same layer with an insulating layer interposed therebetween.

(4)

The solid-state imaging device according to (1) or (2), in which the wiring layer is disposed in a layer that, when compared to the conductive layer, is positioned closer to a substrate on which the photoelectric conversion section and the floating diffusion layer are disposed.

(5)

The solid-state imaging device according to any one of (1) to (4), further including:

a contact that extends in a stacking direction and connects the wiring layer to the source of the second transistor, in which the wiring layer is disposed at a distance from conductive members other than the contact.

(6)

The solid-state imaging device according to any one of (1) to (5), in which the wiring layer is disposed to surround at least a portion of the conductive layer.

(7)

The solid-state imaging device according to any one of (1) to (6), in which the conductive layer includes a first end and a second end, the first end being connected to the floating diffusion layer, the second end being connected to a gate of the second transistor.

(8)

The solid-state imaging device according to any one of (1) to (7), further including:

a third transistor that switches a charge-voltage conversion gain or initializes the electric charge in the floating diffusion layer, in which at least a portion of the wiring layer is disposed between a gate of the third transistor and the conductive layer.

(9)

The solid-state imaging device according to (8), in which the wiring layer, a gate wiring layer connected to the gate of the third transistor, and the conductive layer are disposed in a same layer with an insulating layer respectively interposed therebetween.

(10)

The solid-state imaging device according to (8), in which the wiring layer and the conductive layer are disposed in different layers in a stacking direction with an insulating layer interposed therebetween, and the wiring layer and a gate wiring layer connected to the gate of the third transistor are disposed in a same layer with an insulating layer interposed therebetween.

(11)

The solid-state imaging device according to (8), in which the wiring layer and the conductive layer are disposed in a same layer with an insulating layer interposed therebetween, and the wiring layer and a gate wiring layer connected to the gate of the third transistor are disposed in different layers in a stacking direction with an insulating layer interposed therebetween.

(12)

The solid-state imaging device according to (11), in which the layer in which the gate of the third transistor is disposed is disposed in a layer that, when compared to the wiring layer and the conductive layer, is positioned closer to a substrate on which the photoelectric conversion section and the floating diffusion layer are disposed.

(13)

The solid-state imaging device according to (11), in which the wiring layer and the conductive layer are disposed in a layer that, when compared to the gate wiring layer of the third transistor, is positioned closer to a substrate on which the photoelectric conversion section and the floating diffusion layer are disposed.

(14)

The solid-state imaging device according to (8), in which the conductive layer and a gate wiring layer of the third transistor are disposed in a same layer with an insulating layer interposed therebetween, and the wiring layer is disposed in a layer different from the conductive layer and the gate wiring layer of the third transistor.

(15)

The solid-state imaging device according to (14), in which the wiring layer is disposed in a layer that, when compared to the conductive layer and the gate wiring layer of the third transistor, is positioned closer to a substrate on which the photoelectric conversion section and the floating diffusion layer are disposed.

(16)

The solid-state imaging device according to any one of (1) to (15), further including:

a conductive member that is disposed in a layer different in a stacking direction from the wiring layer and a gate of the second transistor, in which the wiring layer is disposed in a layer between the gate of the second transistor and the conductive member.

(17)

The solid-state imaging device according to any one of (1) to (16), further including:

a first capacitive element;

a second capacitive element;

a pre-stage circuit that sequentially generates a predetermined reset level and a signal level based on an exposure amount, and causes the first and second capacitive elements to respectively retain the generated levels;

a selection circuit that sequentially performs control to connect one of the first and second capacitive elements to a predetermined post-stage node, control to disconnect both of the first and second capacitive elements from the post-stage node, and control to connect another one of the first and second capacitive elements to the predetermined post-stage node;

a post-stage reset transistor that initializes the level of the predetermined post-stage node when both of the first and second capacitive elements are disconnected from the predetermined post-stage node; and a post-stage circuit that sequentially reads out the reset level and the signal level from the first and second capacitive elements through the post-stage node, and outputs the read-out levels, in which the pre-stage circuit includes the photoelectric conversion section, the first transistor, the floating diffusion layer, the second transistor, the conductive layer, and the wiring layer.

(18)

Electronic equipment including:

a solid-state imaging device that outputs a pixel signal obtained by photoelectric conversion of light incident on a pixel area; and a signal processing section that performs signal processing based on the pixel signal, in which the solid-state imaging device includes a photoelectric conversion section that photoelectrically converts incident light and accumulates electric charge, a first transistor that transfers the electric charge accumulated in the photoelectric conversion section, a floating diffusion layer that retains the electric charge transferred by the first transistor, a second transistor that amplifies the electric charge retained in the floating diffusion layer, a conductive layer that conducts to the floating diffusion layer, and a wiring layer that causes capacitive coupling with the conductive layer and conducts to a source of the second transistor.

Aspects of the present disclosure are not limited to the individual embodiments described above, and include various modifications that could easily have been devised by those skilled in the art. Further, advantages of the present disclosure are not limited to those described above. That is, various additions, changes, and partial deletions are possible without departing from the conceptual idea and spirit of the present disclosure that are derived from the contents defined in the appended claims and equivalents thereof.

REFERENCE SIGNS LIST

1: Solid-state imaging device
2: Pixel array section
3: Vertical drive circuit
4: Column signal processing circuit
5: Horizontal drive circuit
6: Output circuit
7: Control circuit
10: Pixel
11: Pre-stage circuit
12: Selection circuit
13: Post-stage circuit
14: Current source
20: Contact
21: FD wiring 21: Conductive layer
22: Wiring layer
24: Vs wiring
24a: First Vs wiring section
24b: Second Vs wiring section
25: FDG wiring
26: SEL wiring
27: VDD wiring
28: Conductive member
30: Semiconductor substrate

The invention claimed is:

1. A solid-state imaging device, comprising:
a photoelectric conversion section configured to:
  photoelectrically convert incident light; and
  accumulate electric charge obtained based on the conversion;
a first transistor configured to transfer the electric charge accumulated in the photoelectric conversion section;
a floating diffusion layer configured to retain the electric charge transferred by the first transistor;
a second transistor configured to amplify the electric charge retained in the floating diffusion layer;
a conductive layer configured to conduct to the floating diffusion layer;
a wiring layer configured to:
  control capacitive coupling with the conductive layer; and
  conduct to a source of the second transistor; and
a first plurality of conductive members which includes a second plurality of conductive members and a contact, wherein
  the contact extends in a stacking direction and configured to connect the wiring layer to the source of the second transistor, and
  the wiring layer is at a distance from the second plurality of conductive members.

2. The solid-state imaging device according to claim 1, wherein a potential of the wiring layer varies in conjunction with a potential of the conductive layer.

3. The solid-state imaging device according to claim 1, wherein
the wiring layer and the conductive layer are in a same layer, and
an insulating layer is between the wiring layer and the conductive layer.

4. The solid-state imaging device according to claim 1, wherein
the wiring layer is in a specific layer,
the specific layer is close to a substrate as compared to the conductive layer, and
the photoelectric conversion section and the floating diffusion layer are on the substrate.

5. The solid-state imaging device according to claim 1, wherein the wiring layer surrounds at least a portion of the conductive layer.

6. The solid-state imaging device according to claim 1, wherein
the conductive layer includes a first end and a second end,
the first end is connected to the floating diffusion layer, and
the second end is connected to a gate of the second transistor.

7. The solid-state imaging device according to claim 1, further comprising:
a third transistor configured to:
  switch a charge-voltage conversion gain, or initialize the electric charge in the floating diffusion layer, wherein at least a portion of the wiring layer is between a gate of
the third transistor and the conductive layer.

8. The solid-state imaging device according to claim 7, wherein
the wiring layer, a gate wiring layer connected to the gate of the third transistor, and the conductive layer are in a same layer, and
each of the wiring layer, the gate wiring layer, and the conductive layer is covered with an insulating layer.

9. The solid-state imaging device according to claim 7, wherein
the wiring layer and the conductive layer are in different layers in the stacking direction,
the wiring layer and a gate wiring layer connected to the gate of the third transistor are in a same layer, and
each of the wiring layer, the conductive layer, and the gate wiring layer are covered with an insulating layer.

10. The solid-state imaging device according to claim 7, wherein
the wiring layer and the conductive layer are in a same layer,
the wiring layer and a gate wiring layer connected to the gate of the third transistor are in different layers in the stacking direction, and
each of the wiring layer, the conductive layer, and the gate wiring layer is covered with an insulating layer.

11. The solid-state imaging device according to claim 10, wherein
the gate of the third transistor is in a first layer,
the first layer is in a second layer,
the second layer is close to a substrate as compared to the wiring layer and the conductive layer, and
the photoelectric conversion section and the floating diffusion layer are on the substrate.

12. The solid-state imaging device according to claim 10, wherein
the wiring layer and the conductive layer are in a first layer,
the first layer is close to a substrate as compared to the gate wiring layer of the third transistor, and
the photoelectric conversion section and the floating diffusion layer are on the substrate.

13. The solid-state imaging device according to claim 7, wherein
the conductive layer and a gate wiring layer of the third transistor are in a same layer,
each of the conductive layer and the gate wiring layer is covered with an insulating layer, and
the wiring layer is in a layer different from the conductive layer and the gate wiring layer of the third transistor.

14. The solid-state imaging device according to claim 13, wherein
the wiring layer is in a specific layer,
the specific layer is close to a substrate as compared to the conductive layer and the gate wiring layer of the third transistor, and
the photoelectric conversion section and the floating diffusion layer are on the substrate.

15. The solid-state imaging device according to claim 1, further comprising:
a conductive member of the first plurality of conductive members that is in a first layer which is different from the wiring layer and a gate of the second transistor in the stacking direction, wherein the wiring layer is in a second layer between the gate of the second transistor and the conductive member.

16. The solid-state imaging device according to claim 1, further comprising:

a first capacitive element;

a second capacitive element;

a pre-stage circuit configured to:

sequentially generate a specific reset level and a signal level based on an exposure amount, and control the first capacitive element to retain the generated specific reset level and the second capacitive element to retain the generated signal level;

a selection circuit configured to:

sequentially control to connect the first capacitive element to a specific post-stage node, control to disconnect both of the first capacitive element and the second capacitive element from the specific post-stage node, and control to connect the second capacitive element to the specific post-stage node;

a post-stage reset transistor configured to initialize a level of the specific post-stage node in a case where both of the first capacitive element and second capacitive element are disconnected from the specific post-stage node; and a post-stage circuit configured to:

sequentially read the specific reset level and the signal level from the first capacitive element and the second capacitive element through the specific post-stage node, and output the read specific reset level and the read signal level, wherein the pre-stage circuit includes the photoelectric conversion section, the first transistor, the floating diffusion layer, the second transistor, the conductive layer, and the wiring layer.

17. An electronic equipment, comprising:

a solid-state imaging device configured to output a pixel signal obtained by photoelectric conversion of light incident on a pixel area; and a signal processing section configured to execute signal processing based on the pixel signal, wherein the solid-state imaging device includes:

a photoelectric conversion section configured to:

photoelectrically convert incident light, and accumulate electric charge obtained based on the conversion, a first transistor configured to transfer the electric charge accumulated in the photoelectric conversion section, a floating diffusion layer configured to retain the electric charge transferred by the first transistor, a second transistor configured to amplify the electric charge retained in the floating diffusion layer, a conductive layer configured to conduct to the floating diffusion layer, a wiring layer configured to:

control capacitive coupling with the conductive layer, and conduct to a source of the second transistor, and a first plurality of conductive members which includes a second plurality of conductive members and a contact, wherein the contact extends in a stacking direction and configured to connect the wiring layer to the source of the second transistor, and the wiring layer is at a distance from the second plurality of conductive members.

* * * * *